(12) United States Patent
Mukaida

(10) Patent No.: US 7,315,870 B2
(45) Date of Patent: Jan. 1, 2008

(54) MEMORY CONTROLLER, FLASH MEMORY SYSTEM, AND METHOD FOR RECORDING DATA ON FLASH MEMORY

(75) Inventor: Naoki Mukaida, Tokyo (JP)

(73) Assignee: TDK Corporation (JP)

( * ) Notice: Subject to any disclaimer, the term of this patent is extended or adjusted under 35 U.S.C. 154(b) by 294 days.

(21) Appl. No.: 11/023,746

(22) Filed: Dec. 27, 2004

(65) Prior Publication Data

US 2005/0162930 A1 Jul. 28, 2005

(30) Foreign Application Priority Data

Dec. 26, 2003 (JP) .............................. 2003-432516

(51) Int. Cl.
*G06F 12/12* (2006.01)

(52) U.S. Cl. ................... 707/203; 711/103; 711/159; 717/170

(58) Field of Classification Search .................. None
See application file for complete search history.

(56) References Cited

U.S. PATENT DOCUMENTS

| | | | | |
|---|---|---|---|---|
| 5,535,369 A | * | 7/1996 | Wells et al. ................. | 711/171 |
| 6,076,137 A | * | 6/2000 | Asnaashari .................. | 711/103 |
| 6,115,785 A | * | 9/2000 | Estakhri et al. ............. | 711/103 |
| 6,145,051 A | * | 11/2000 | Estakhri et al. ............. | 711/103 |
| 6,763,424 B2 | * | 7/2004 | Conley ........................ | 711/103 |
| 2002/0188814 A1 | * | 12/2002 | Saito et al. .................. | 711/159 |

* cited by examiner

*Primary Examiner*—B. James Peikari
(74) *Attorney, Agent, or Firm*—Townsend and Townsend and Crew

(57) ABSTRACT

There is disclosed a controller included in a flash memory system attachable to a memory interface of a host system. If a block in which new data is written and a block in which old data is written are present simultaneously, the controller determines in which block the newest data is written, based on version identifier stored in a redundant area of a flash memory. Specifically, the controller has an access control function for controlling access to the flash memory, an address managing function for managing correspondence between a logical block address supplied from the host system and a physical block address in the flash memory, a version identifier setting function for writing version identifier in the redundant area of the flash memory, and a version identifying function for identifying a block in which newest data corresponding to a same logical block address is written based on the version identifier.

15 Claims, 14 Drawing Sheets

FIG. 7

REDUNDANT AREA

IN ORDER OF PHYSICAL BLOCK ADDRESSES →

| | VERSION IDENTIFIER | CORRESPONDING LOGICAL BLOCK ADDRESS |
|---|---|---|
| 0 | 0000 | 000 0000 0000 |
| 1 | 0110 | 000 0000 0010 |
| 2 | 0011 | 000 0000 0011 |
| 3 | 0101 | 000 0000 1001 |
| 4 | 0001 | 000 0000 0001 |
| 5 | 1001 | 000 0000 0110 |
| 6 | 1111 | 111 1111 1111 |
| 7 | 0000 | 000 0000 1101 |
| 8 | 1101 | 000 0000 1110 |
| 9 | 0011 | 000 1000 0011 |
| 10 | 0101 | 000 1000 0001 |
| • | • | • |
| • | • | • |
| • | • | • |
| 1020 | 1111 | 111 1111 1111 |
| 1021 | 0010 | 000 1000 0110 |
| 1022 | 1111 | 111 1111 1111 |
| 1023 | 0000 | 000 1100 0001 |

FIG. 8

| # | Value | Code | Data |
|---|---|---|---|
| #0 | 0 | 0000 | 000 0000 0000 |
| #1 | 6 | 0001 | 000 0000 0000 |
| #2 | 17 | 0010 | 000 0000 0000 |
| #3 | 175 | 0011 | 000 0000 0000 |
| #4 | 503 | 0100 | 000 0000 0000 |
| #5 | 875 | 0101 | 000 0000 0000 |
| #6 | 1013 | 0110 | 000 0000 0000 |
| #7 | 77 | 0111 | 000 0000 0000 |
| #8 | 303 | 1000 | 000 0000 0000 |
| #9 | 538 | 1001 | 000 0000 0000 |
| #10 | 987 | 1010 | 000 0000 0000 |
| #11 | 98 | 1011 | 000 0000 0000 |
| #12 | 298 | 1100 | 000 0000 0000 |
| #13 | 454 | 1101 | 000 0000 0000 |
| #14 | 773 | 1110 | 000 0000 0000 |
| #15 | 1017 | 1111 | 000 0000 0000 |
| #16 | 26 | 0000 | 000 0000 0000 |

FIG. 9

REDUNDANT AREA

| | VERSION IDENTIFIER | CORRESPONDING LOGICAL BLOCK ADDRESS | |
|---|---|---|---|
| 0 | 0000 | 000 0000 0000 | ← |
| 1 | 0110 | 000 0000 0010 | |
| 2 | 0011 | 000 0000 0011 | |
| 3 | 0101 | 000 0000 1001 | |
| 4 | 0001 | 000 0000 0001 | |
| 5 | 1001 | 000 0000 0110 | |
| 6 | 0001 | 000 0000 0000 | ← |
| 7 | 0000 | 000 0000 1101 | |
| 8 | 1101 | 000 0000 1110 | |
| 9 | 0011 | 000 1000 0011 | |
| 10 | 0101 | 000 1000 0001 | |
| ⋮ | ⋮ | ⋮ | |
| 1020 | 1111 | 111 1111 1111 | |
| 1021 | 0010 | 000 1000 0110 | |
| 1022 | 1111 | 111 1111 1111 | |
| 1023 | 0000 | 000 1100 0001 | |

IN ORDER OF PHYSICAL BLOCK ADDRESSES ↓

FIG. 10

IN ORDER OF LOGICAL BLOCK ADDRESSES →

| | VERSION IDENTIFIER | PHYSICAL BLOCK ADDRESS |
|---|---|---|
| 0 | 0000 | 000 0000 0000 |
| 1 | 0110 | 000 0000 0010 |
| 2 | 0011 | 000 0000 0011 |
| 3 | 0101 | 000 0000 1001 |
| 4 | 0001 | 000 0000 0001 |
| 5 | 1001 | 000 0000 0110 |
| 6 | 1111 | 111 1111 1111 |
| 7 | 0000 | 000 0000 1101 |
| 8 | 1101 | 000 0000 1110 |
| 9 | 0011 | 000 1000 0011 |
| 10 | 0101 | 000 1000 0001 |
| • | • | • |
| • | • | • |
| • | • | • |
| 998 | 1111 | 111 1111 1111 |
| 999 | 0010 | 000 1000 0110 |

} 1000 BLOCKS

FIG. 11

| | | REDUNDANT AREA | |
|---|---|---|---|
| | | VERSION IDENTIFIER | CORRESPONDING LOGICAL BLOCK ADDRESS |
| IN ORDER OF PHYSICAL BLOCK ADDRESSES | 0 | 11 1111 1111 | 000 0000 0000 |
| | 1 | 00 0001 0000 | 000 0000 0001 |
| | 2 | 01 0000 0100 | 000 0000 0011 |
| | 3 | 00 1111 0001 | 000 0000 0110 |
| | 4 | 11 1111 1111 | 111 1111 1111 |
| | 5 | 00 0000 0101 | 000 0000 0101 |
| | 6 | 01 0000 1000 | 000 0000 0111 |
| | 7 | 00 1100 1111 | 000 0000 1000 |
| | 8 | 11 1111 1111 | 111 1111 1111 |
| | 9 | 10 0000 1000 | 000 0000 0101 |
| | 10 | 11 0000 0010 | 000 0000 0111 |
| | ⋮ | ⋮ | ⋮ |
| | 1020 | 00 1100 1010 | 000 0000 0111 |
| | 1021 | 00 1110 1000 | 000 0000 1000 |
| | 1022 | 11 1111 1111 | 111 1111 1111 |
| | 1023 | 00 1110 0100 | 000 0000 0101 |

FIG. 13

| | | VERSION IDENTIFIER | CORRESPONDING LOGICAL BLOCK ADDRESS | |
|---|---|---|---|---|
| | 0 | 11 1111 1111 | 000 0000 0000 | ⇐ |
| | 1 | 00 0001 0000 | 000 0000 0001 | |
| | 2 | 01 0000 0100 | 000 0000 0011 | |
| | 3 | 00 1111 0001 | 000 0000 0110 | |
| | 4 | 00 0000 0000 | 000 0000 0000 | ⇐ |
| | 5 | 00 0000 0101 | 000 0000 0101 | |
| | 6 | 01 0000 1000 | 000 0000 0111 | |
| | 7 | 00 1100 1111 | 000 0000 1000 | |
| | 8 | 11 1111 1111 | 111 1111 1111 | |
| | 9 | 10 0000 1000 | 000 0000 0101 | |
| | 10 | 11 0000 0010 | 000 0000 0111 | |
| | · | · | · | |
| | · | · | · | |
| | · | · | · | |
| | 1020 | 00 1100 1010 | 000 0000 0111 | |
| | 1021 | 00 1110 1000 | 000 0000 1000 | |
| | 1022 | 11 1111 1111 | 111 1111 1111 | |
| | 1023 | 00 1110 0100 | 000 0000 0101 | |

REDUNDANT AREA

IN ORDER OF PHYSICAL BLOCK ADDRESSES

| 0 | 0 | 0 | 0 | 0 | 0 | 0 | 0 |
|---|---|---|---|---|---|---|---|
| 0 | 0 | 0 | 0 | 0 | 0 | 0 | 0 |
| 0 | 0 | 0 | 0 | 0 | 0 | 0 | 0 |
| 0 | 0 | 0 | 0 | 1 | 0 | 0 | 0 |
| 0 | 0 | 0 | 0 | 0 | 0 | 0 | 0 |
| 0 | 1 | 0 | 0 | 0 | 0 | 0 | 0 |
| ⋮ | ⋮ | ⋮ | ⋮ | ⋮ | ⋮ | ⋮ | ⋮ |
| 0 | 0 | 0 | 0 | 0 | 1 | 0 | 0 |
| 0 | 1 | 0 | 0 | 0 | 0 | 0 | 0 |

| 0 | 0 | 0 | 0 | 0 | 0 | 0 | 0 |
|---|---|---|---|---|---|---|---|
| 0 | 0 | 0 | 0 | 0 | 0 | 0 | 0 |
| 0 | 0 | 0 | 0 | 0 | 0 | 0 | 0 |
| 0 | 0 | 0 | 1 | 0 | 0 | 0 | 0 |
| 0 | 0 | 0 | 0 | 0 | 0 | 0 | 0 |
| 0 | 1 | 0 | 0 | 0 | 0 | 0 | 0 |
| ⋮ | ⋮ | ⋮ | ⋮ | ⋮ | ⋮ | ⋮ | ⋮ |
| 0 | 0 | 0 | 0 | 0 | 1 | 0 | 0 |
| 0 | 1 | 0 | 0 | 0 | 0 | 0 | 0 |

1023

MEMORY CONTROLLER, FLASH MEMORY SYSTEM, AND METHOD FOR RECORDING DATA ON FLASH MEMORY

CROSS-REFERENCES TO RELATED APPLICATIONS

This application claims priority to Japanese Patent Application No. 2003-432516 filed Dec. 26, 2003.

BACKGROUND OF THE INVENTION

1. Field of the Invention

The present invention relates to a flash memory controller, a flash memory system having the controller, and a method for recording data on a flash memory.

2. Description of the Related Art

Recently, flash memories are widely used as semiconductor memories such as memory cards and silicon disks that are used in a memory system. A flash memory is a kind of nonvolatile memories. It is required that data stored in a flash memory be retained even when electric power is not supplied to the flash memory.

A NAND type flash memory is a kind of flash memories used particularly frequently in the memory system described above. Each of a plurality of memory cells included in a NAND type flash memory can change from an erased state where data representing a logic value "1" is stored to a written state where data representing a logic value "0" is stored, independently from the other memory cells. Contrary to this, when at least one of the plurality of memory cells has to change from the written state to the erased state, each memory cell cannot change independently from the other memory cells. At this time, a predetermined number of memory cells included in a so-called block have to change to the erased state simultaneously. This simultaneous erasing operation is generally called "block erasing". A block which undergoes the block erasing is called "erased block".

Because of the above-described characteristic, a NAND type flash memory cannot be overwritten with new data. In order to rewrite data stored in a memory cell, it is necessary to write block data containing new data in an erased block, and then execute block erasing for the block storing the old data. The data replacing the old data is written in a block different from the block in which the old data has been stored. Therefore, the correspondence between a logical block address designated by an address signal supplied from a host system and a physical block address indicating the actual block address in the flash memory dynamically changes each time data is rewritten in the flash memory. Accordingly, in a memory system utilizing a flash memory, information regarding the correspondence between the logical block address and the physical block address must be retained.

For example, Unexamined Japanese Patent Application KOKAI Publication No. H10-124384 discloses a flash memory system for writing the logical block address of data written in a block in the redundant area of the block, and managing the correspondence between the logical block address and the physical block address based on the information written in the redundant area.

When a flash memory is to be accessed, an address translation table indicating the correspondence between the logical block address and the physical block address is used. The address translation table is generated with reference to the logical block address written in the redundant area.

As described above, the following two steps are required in order to rewrite data stored in a memory cell. First, block data containing new data is written in an erased block. Second, block erasing is executed for the block in which the old data is stored. Accordingly, as long as erasing of the block in which the old data is written is executed properly, the flash memory is not left in a state where the same logical address is written in the redundant areas of different blocks. However, in a case where the power supply is stopped before block erasing for the block in which the old data is written is executed, the flash memory is left in the state where the same logical address is written in the redundant areas of different blocks. In such a case, it is difficult to determine in the following operation, data written in which block is the new data. As a result, the new data might be erased by mistake.

BRIEF SUMMARY OF THE INVENTION

An object of the present invention is to enable determination in which block the newest data is written, in a case where a block in which new data is written and a block in which old data is written are present simultaneously.

A memory controller according to a first aspect of the present invention comprises:
 an access unit which accesses a flash memory;
 an address managing unit which manages correspondence between a logical block address in a host system and a physical block address in the flash memory;
 a version identifier setting unit which writes identification information (hereinafter referred to as version identifier) for identifying a block in which new data is written and a block in which old data is written, in a redundant area of the flash memory; and
 a version identifying unit which identifies a block in which newest data is written, from a plurality of blocks corresponding to a same logical block address, based on the version identifier.

The version identifier may include information representing a value which is increased or decreased each time data corresponding to the same logical block address is rewritten.

The version identifier may include information which is based on a physical block address of a block in which prior data corresponding to the same logical block address is stored.

A flash memory system according to a second aspect of the present invention comprises:
 a flash memory;
 an access unit which accesses the flash memory;
 an address managing unit which manages correspondence between a logical block address in a host system and a physical block address in the flash memory;
 a version identifier setting unit which writes version identifier in a redundant area of the flash memory; and
 a version identifying unit which identifies a block in which newest data is written, from a plurality of blocks corresponding to a same logical block address, based on the version identifier.

The version identifier may include information representing a value which is increased or decreased each time data corresponding to the same logical block address is rewritten.

The version identifier may include information which is based on a physical block address of a block in which prior data corresponding to the same logical block address is stored.

A method for recording data on a flash memory according to a third aspect of the present invention comprises:

writing data in a data area of a flash memory;
setting version identifier in a redundant area of the flash memory; and
identifying a block in which newest data is written, from a plurality of blocks corresponding to a same logical block address, based on the version identifier.

The version identifier may be information representing a value which is increased or decreased each time data corresponding to the same logical block address is rewritten.

The version identifier may be information which is based on a physical block address of a block in which prior data corresponding to the same logical block address is stored.

A memory controller according to a forth aspect of the present invention comprises:
a receiver which receives data to be written in a flash memory and a logical block address thereof from a host system;
a physical address designator which designates a physical block address of a block of the flash memory into which the data received by the receiver is to be written;
a version identifier manager which assigns version identifiers to the data, the version identifiers representing versions of data to which a same logical block address is assigned, for each of logical block addresses;
an access unit which writes data supplied from the host system to an empty block of the flash memory whose physical block address is designated by the physical address designator, and a corresponding logical block address and a corresponding version identifier assigned by the version identifier manager to a redundant area of the corresponding block, and
an effective block identifying unit which searches blocks storing a same logical block address, and in case of finding blocks storing a same logical block address, identifies an effective block which stores newest data, from the blocks storing the same logical block address, based on the version identifiers stored in the redundant areas of the blocks.

The version identifier may include information representing a value which is increased or decreased each time data corresponding to the same logical block address is written into the flash memory.

The version identifier may include information which is prepared based on a physical block address of a block in which prior data corresponding to the same logical block address is stored.

The memory controller may comprise an address managing unit which stores data representing correspondence between the logical block address designated by the host system and the physical block address of the flash memory into which corresponding data is stored.

The access unit may access the flash memory based on the data representing the correspondence stored in the address managing unit.

The effective block identifying unit, when the memory controller is initialized, performing a process of reading the flash memory, preparing the data representing the correspondence, and storing the prepared data to the address managing unit, may perform the searching and identifying, based on the version identifiers, and prepare the data representing the correspondence.

A flash memory system according to a fifth aspect of the present invention comprises:
a flash memory; and
the memory controller according to a forth aspect of the present invention.

A memory controller according to a sixth aspect of the present invention comprises:
access means for accessing a flash memory;
address managing means for managing correspondence between a logical block address in a host system and a physical block address in the flash memory;
version identifier setting means for writing version identifier in a redundant area of the flash memory; and
version identifying means for identifying a block in which newest data is written, from a plurality of blocks corresponding to a same logical block address, based on the version identifier.

BRIEF DESCRIPTION OF THE DRAWINGS

These objects and other objects and advantages of the present invention will become more apparent upon reading of the following detailed description and the accompanying drawings in which:
FIG. 7 is a schematic diagram showing correspondence between version identifier and a corresponding logical block address.
FIG. 8 is a schematic diagram showing procedures for updating version identifier.
FIG. 9 is a schematic diagram showing correspondence between version identifier and a corresponding logical block address.
FIG. 10 is a schematic diagram showing an example of configuration of an address translation table.
FIG. 11 is a schematic diagram showing correspondence between version identifier and a corresponding logical block address.
FIG. 13 is a schematic diagram showing correspondence between version identifier and a corresponding logical block address.
FIG. 14 are schematic diagrams showing examples of configuration of an erased block search table.

DETAILED DESCRIPTION OF THE INVENTION

Figure 1:
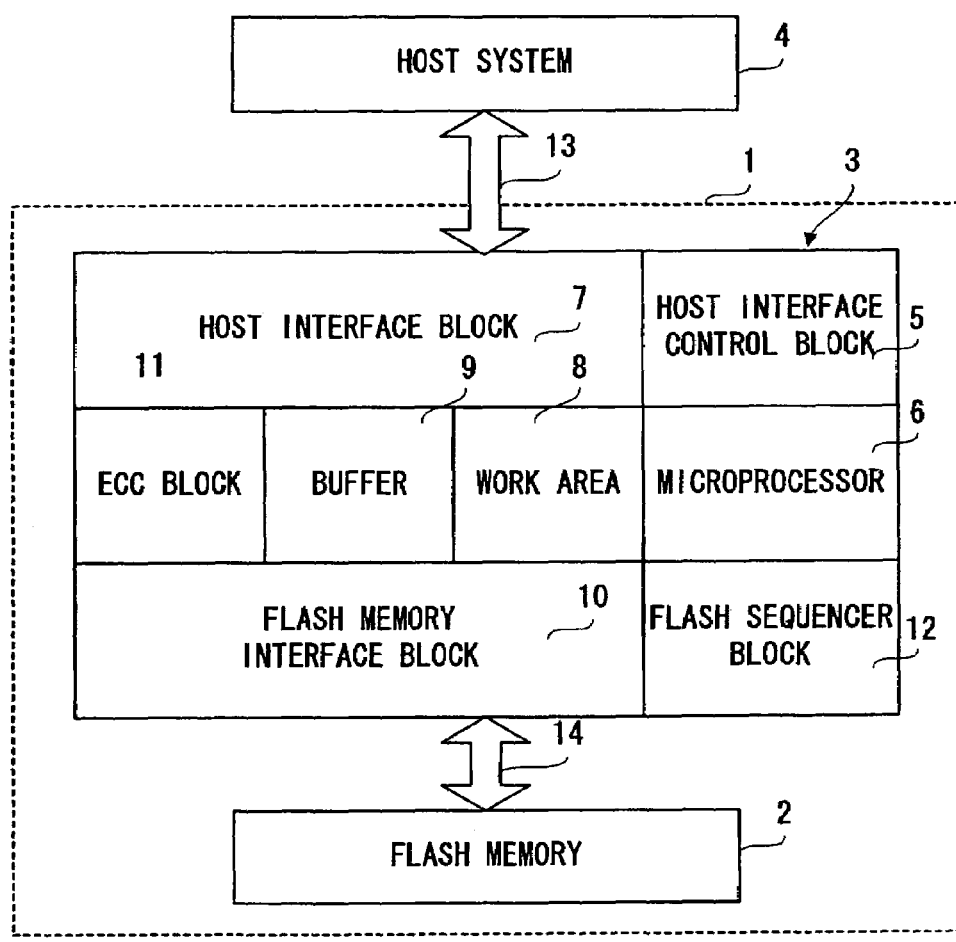
FIG. 1 is a block diagram of a flash memory system according to the present invention.

FIG. 1 is a block diagram schematically showing a flash memory system 1 according to the present invention. The flash memory system 1 comprises a flash memory 2 and a controller 3. The flash memory system 1 is attachable to a memory interface of a host system 4. With the flash memory system 1 attached to the host system 4, the host system 4 can work the flash memory system 1 as an external storage device.

The host system 4 may be an information processing apparatus of various types such as a personal computer, a digital still camera, etc. for processing text, audio, image information, and other kinds of information.

The flash memory 2 shown in FIG. 1 is a nonvolatile memory. The flash memory executes reading or writing in a page unit. On the other hand, data stored in the flash memory 2 is erased in a so-called block unit. One block includes, for example, 32 pages. One page includes a data area 25 (shown in FIG. 4) having 512 bytes and a redundant area 26 (shown in FIG. 4) having 16 bytes.

In FIG. 1, the controller 3 comprises a host interface control block 5, a microprocessor 6, a host interface block 7, a work area 8, a buffer 9, a flash memory interface block 10, an ECC (Error Correction Code) block 11, and a flash memory sequencer block 12. The controller 3 is integrated on, for example, one semiconductor chip. The function of each block of the controller 3 will be described below.

The host interface control block 5 is a functional block for controlling operations of the host interface block 7. The host interface control block 5 has a plurality of registers (unillustrated). The host interface control block 5 controls operations of the host interface block 7 based on information set in each register.

The microprocessor 6 is a functional block for controlling entire operations of the controller 3.

The host interface block 7 is a functional block for exchanging information representing data, address, status, external command, etc. with the host system 4. When the flash memory system 1 is attached to the host system 4, the flash memory system 1 and the host system 4 are connected to each other via an external bus 13. Data, etc. that is to be supplied from the host system 4 to the flash memory system 1 is acquired into the controller 3 via the host interface block 7. Data, etc. that is to be supplied from the flash memory system 1 to the host system 4 is supplied to the host system 4 via the host interface block 7.

The host interface block 7 includes a task file register (unillustrated) for temporarily storing a host address and an external command supplied from the host system 4, and an error register (unillustrated) which is set when an error occurs.

The work area 8 is a memory module for temporarily storing data used for controlling the flash memory 2. The work area 8 is formed of, for example, a plurality of SRAM (Static Random Access Memory) cells.

The buffer 9 is a functional block for retaining data read from the flash memory 2 and data to be written on the flash memory 2. Data read from the flash memory 2 is retained in the buffer 9 until output to the host system 4. Data to be written on the flash memory 2 is retained in the buffer 9 until the flash memory 2 is ready for writing operation.

The flash memory interface block 10 is a functional block for exchanging information representing data, address, status, internal command, etc. with the flash memory 2 via an internal bus 14.

The ECC block 11 is a functional block for generating an error correction code to be affixed to the data to be written on the flash memory 2. In addition, the ECC block 11 detects and corrects an error included in data read from the flash memory 2, based on an error correction code included in the read data.

The flash memory sequencer block 12 is a functional block for controlling operations of the flash memory 2 based on an internal command. The flash memory sequencer block 12 includes a plurality of registers (unillustrated). The flash memory sequencer block 12 sets information used when executing an internal command in the plurality of registers, under the control of the microprocessor 6. After setting information in the plurality of registers, the flash memory sequencer block 12 performs operations in accordance with the internal command, based on the information set in the registers. The internal command is a command supplied from the controller 3 to the flash memory 2. The internal command is different from an external command, which is a command supplied from the host system 4 to the flash memory system 1.

Figure 2:
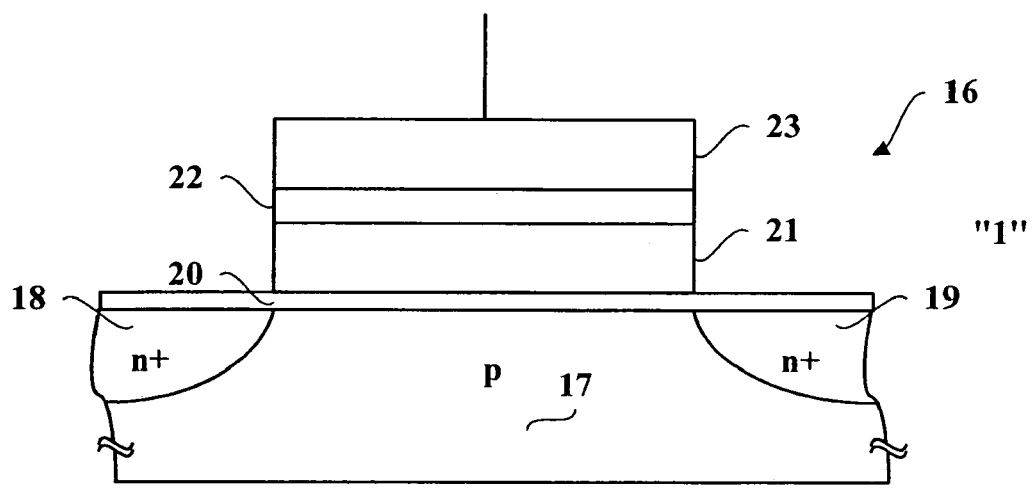
FIG. 2 is a cross-sectional diagram schematically showing the structure of a memory cell.
Figure 3:
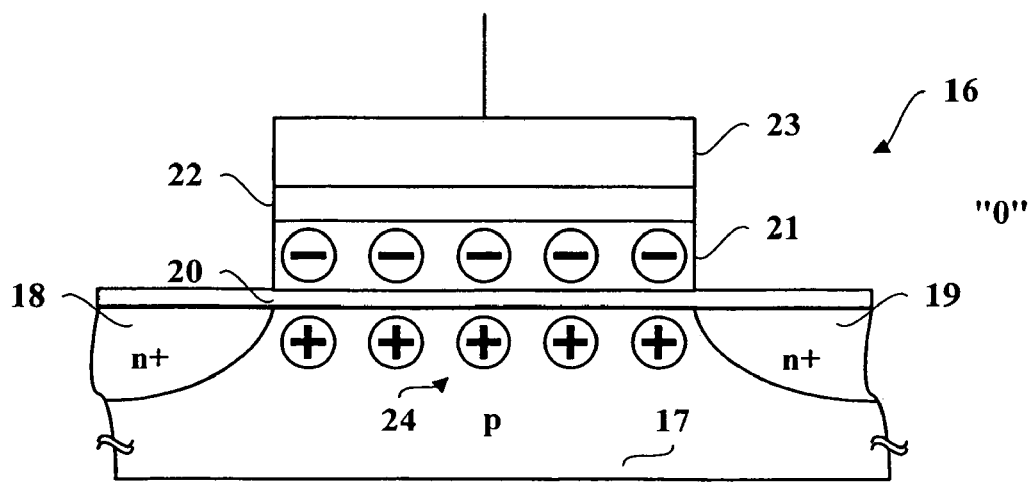
FIG. 3 is a cross-sectional diagram of a memory cell in a written state.

With reference to FIG. 2 and FIG. 3, the structure of a memory cell 16 included in the flash memory 2 will be explained. FIG. 2 and FIG. 3 are cross-sectional diagrams schematically showing the structure of a memory cell 16 included in the flash memory 2. In FIG. 2, no data is written on the memory cell 16. In FIG. 3, data is written on the memory cell 16.

As shown in FIG. 2 and FIG. 3, the memory cell 16 comprises a P-type semiconductor substrate 17, an N-type source diffusion region 18, an N-type drain diffusion region 19, a tunnel oxide film 20, a floating gate electrode 21, an insulation film 22, and a control gate electrode 23. The source diffusion region 18 and the drain diffusion region 19 are both formed on the P-type semiconductor substrate 17. The tunnel oxide film 20 covers the P-type semiconductor substrate 17 between the source diffusion region 18 and the drain diffusion region 19. The floating gate electrode 21 is formed on the tunnel oxide film 20. The insulation film 22 is formed on the floating gate electrode 21. The control gate electrode 23 is formed on the insulation film 22. In the flash memory 2, a plurality of memory cells 16 are connected in series. One memory cell 16 stores one-bit data.

As shown in FIG. 2, when no electrons are stored in the floating gate electrode 21, the memory cell 16 is in an erased state. On the other hand, as shown in FIG. 3, when electrons are stored in the floating gate electrode 21, the memory cell 16 is in a written state. The memory cell 16 in the erased state stores data representing a logic value "1". The memory cell 16 in the written state stores data representing a logic value "0".

When a read voltage predetermined for reading data stored in a memory cell 16 is not applied to the control gate electrode 23 of a memory cell 16 in the erased state, no channel is formed in a surface of the P-type semiconductor substrate 17 between the source diffusion region 18 and the drain diffusion region 19. Accordingly, the source diffusion region 18 and the drain diffusion region 19 are electrically insulated from each other.

On the other hand, when a read voltage is applied to the control gate 23 of a memory cell in the erased state, a channel (unillustrated) is formed in the surface of the P-type semiconductor substrate 17 between the source diffusion region 18 and the drain diffusion region 19. Accordingly, the source diffusion region 18 and the drain diffusion region 19 are electrically connected to each other via the channel.

As described above, when a read voltage is not applied to the control gate electrode 23 of a memory cell 16 in the erased state, the source diffusion region 18 and the drain diffusion region 19 are electrically insulated. When a read voltage is applied to the control gate electrode 23 of a memory cell 16 in the erased state, the source diffusion region 18 and the drain diffusion region 19 are electrically connected.

As shown in FIG. 3, when electrons are stored in the floating gate electrode 21, the memory cell 16 is in a written state. The floating gate electrode 21 is sandwiched between the tunnel oxide film 20 and the insulation film 22. Therefore, once electrons are injected into the floating gate electrode 21, the electrons remain in the floating gate electrode 21 for an extremely long time due to a potential barrier. Regardless of whether a read voltage is applied to the control gate electrode 23 or not, a channel 24 is formed in the surface of the P-type semiconductor substrate 17 between the source diffusion region 18 and the drain diffusion region 19, by the electrons stored in the floating gate electrode 21 of a memory 16 in the written state. Accordingly, when a memory cell 16 is in the written state, the source diffusion region 18 and the drain diffusion region 19 are electrically connected regardless of whether the read voltage is applied to the control gate electrode 23.

A data reading operation for identifying whether a memory cell 16 is in the erased state or in the written state will be explained below. In the flash memory 2, the plurality of memory cells 16 are connected in series. One of the plurality of memory cells 16 is selected by the controller 3. A predetermined low-level voltage is applied to the control gate electrode 23 attached to the selected memory cell 16. A predetermined high-level voltage (read voltage) which is higher than the predetermined low-level voltage is applied to the control gates 23 attached to the other memory cells 16 of the plurality of memory cells 16. In this state, it is detected whether the memory cells 16 connected in series are all electrically continuous, by using a predetermined detector. If the detector detects an electrically continuous state, the selected memory cell 16 is in the written state. If the detector detects an electrically discontinuous state, the selected memory cell 16 is in the erased state. The flash memory 2 is programmed to read data representing the logic value "0" or "1" from an arbitrary one of the memory cells 16 connected in series in this way.

When a memory cell 16 is to be changed between the erased state and the written state, an erase voltage or a write voltage is used that is higher than one that is applied in the data reading operation for a memory cell 16. In a case where a memory cell 16 in the erased state is to be changed to the written state, a write voltage is applied to the control gate electrode 23 such that the potential of the control gate electrode 23 becomes higher than the potential of the floating gate voltage 21. Due to the write voltage, an FN (Fowler-Nordhaim) tunnel current flows between the P-type semiconductor substrate 17 and the floating gate electrode 21 via the tunnel oxide film 20. As a result, electrons are injected into the floating gate electrode 21. In a case where a memory cell 16 in the written state is to be changed to the erased state, an erase voltage is applied to the control gate electrode 23 such that the potential of the control gate electrode 23 becomes lower than the potential of the floating gate electrode 21. Due to the erase voltage, the electrons stored in the floating gate electrode 21 are discharged to the P-type semiconductor substrate 17 via the tunnel oxide film 20.

Figure 4:
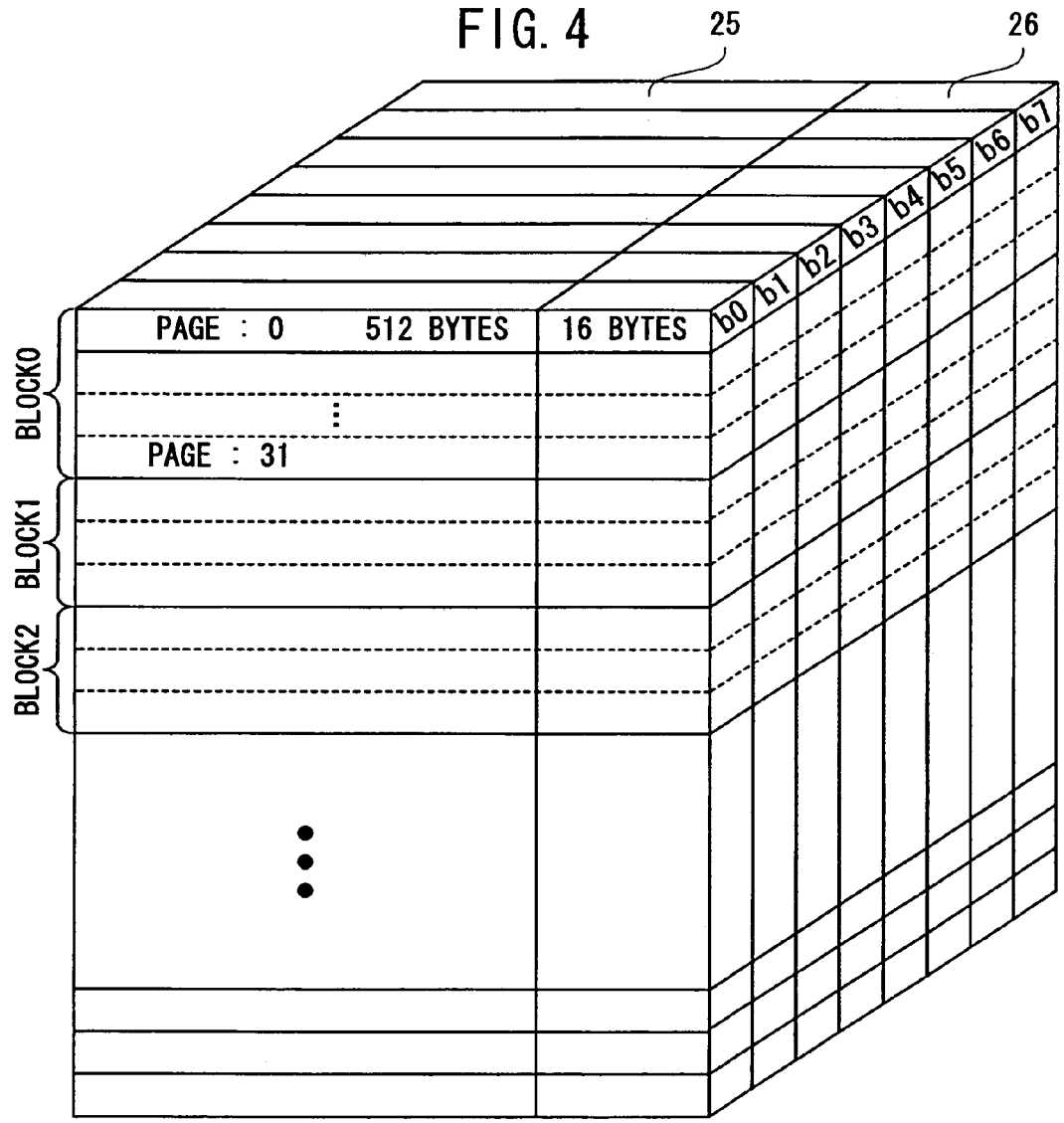
FIG. 4 is a schematic diagram of an address space in a flash memory.

The structure of the flash memory 2 for storing data will be described below. FIG. 4 schematically shows the address space of the flash memory 2. In the structure shown in FIG. 4, the address space of the flash memory 2 is divided on the basis of "pages" and "blocks". Page is a process unit for the data reading operation and the data writing operation executed in the flash memory 2. Block is a process unit for the data erasing operation executed in the flash memory 2.

One page includes a 512-byte data area 25 and a 16-byte redundant area 26. The data area 25 stores data supplied from the host system 4. The redundant area 26 stores additional information representing an error correction code (ECC), a corresponding logical block address, a block status, etc.

The error correction code is used for correcting an error included in the data stored in the data area 25. In a case where the error included in the data stored in the data area 25 is not more than a predetermined threshold, the error can be corrected by the error correction code.

The corresponding logical block address indicates the address of a logical block to which a block is associated, in a case where at least one data area 25 included in the block stores effective data. The logical block address is a block address determined based on a host address supplied from the host system 4. The actual block address in the flash memory 2 is called physical block address.

In a case where effective data is stored in none of the data areas 25 included in one block, no corresponding logical block address is stored in the redundant area 26 included in the bock. Accordingly, by determining whether a corresponding logical block address is stored or not in a redundant area 26, it is possible to determine whether data has been erased in the block including the redundant area 26. In a case where no corresponding logical block address is stored in a redundant area 26, the block including the redundant area 26 is in the data erased state.

The block status indicates whether each block is a defective block which cannot store data properly. In a case where a block is a defective block, for example, a block status flag prepared for the block is set to an on state.

In the flash memory 2, a memory cell 16 cannot be changed from the written state to the erased state in the cell unit. A memory cell 16 can be changed from the written state to the erased state only in the block unit. Therefore, in order to store data in a certain page, it is necessary to write block data including new data in an erased block, and then execute block erasing in the block storing the old data. Block erasing is executed in the block unit. Thus, in the block including the page that stores the old data, data in all the pages are erased. Accordingly, in order to rewrite data in a certain page, it is necessary to also move the data in the other pages in the block including the page to an erased block.

In a case where data is to be rewritten in the way described above, the block to store the new data for replacing the old data is different from the block that stores the old data. Because of this, the correspondence between the logical block address designated by an address signal supplied from the host system 4 and the physical block address indicating the actual block address in the flash memory 2 dynamically changes each time data is written in the flash memory 2. Therefore, an address translation table that indicates the correspondence between the logical block address and the physical block address is necessary. The address translation table is generated based on the corresponding logical block address written in the redundant area 26 of the flash memory 2. Each time data is rewritten, the correspondence of the portion related to the rewriting is updated in the address translation table.

The flash memory system 1 according to the present invention is used with the area in the flash memory 2 divided into a plurality of zones. Each zone includes a plurality of blocks of the flash memory 2. In the example shown in FIG. 5, one zone includes 1024 blocks B0 to B1023. Each block includes 32 pages P00 to P31. Block is a process unit for data erasing operation. Page is a process unit for data reading operation and data writing operation.

Figure 5:
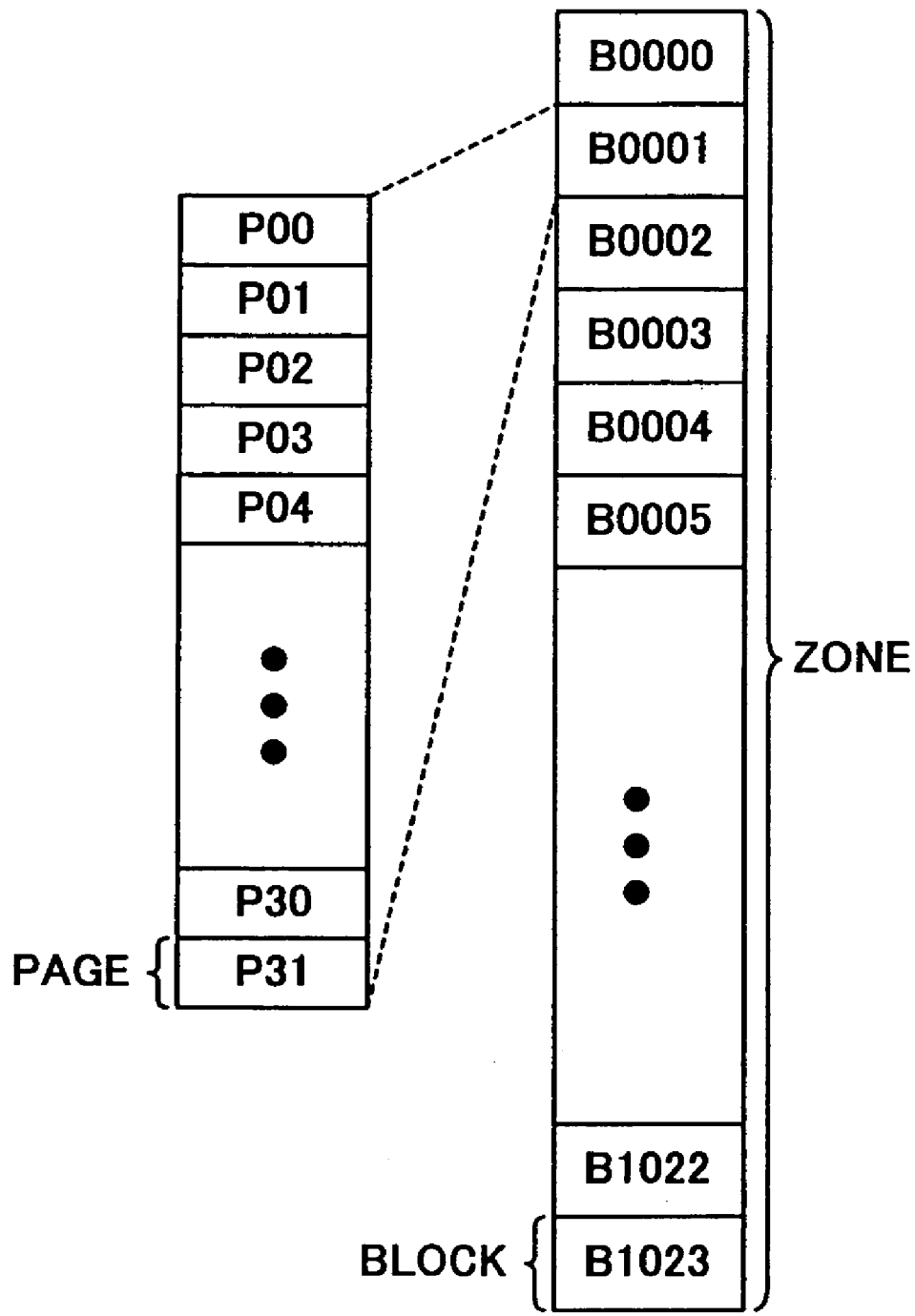
FIG. 5 is a schematic diagram of an example of zone assignment in a flash memory.
Figure 6:
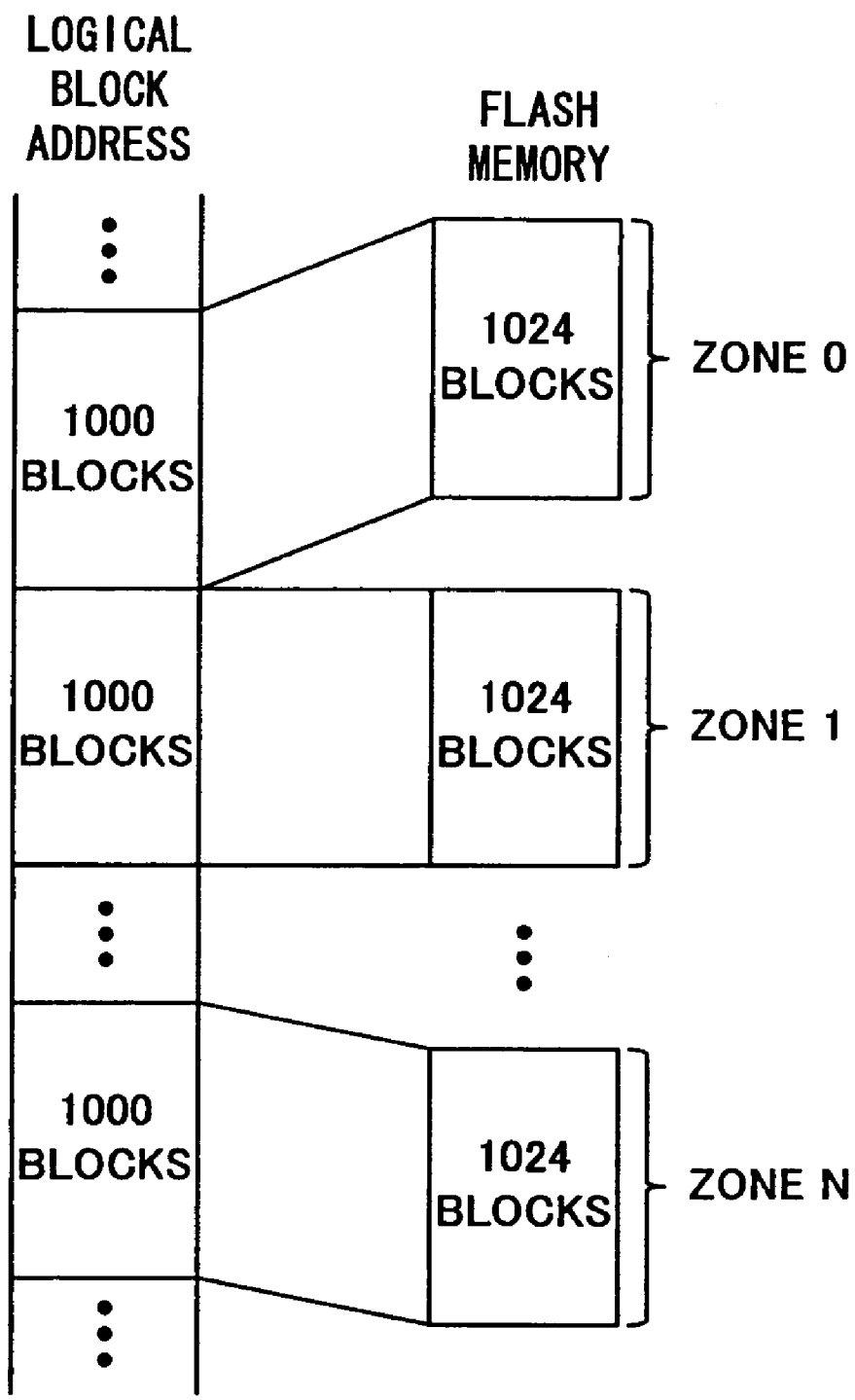
FIG. 6 is a schematic diagram showing correspondence between a zone and a logical block address space.

The zone shown in FIG. 5 is assigned to a logical block address space having a predetermined range in the host system 4. In the example shown in FIG. 6, a zone including 1024 blocks is assigned to a logical block address space having a data capacity corresponding to 1000 blocks. In this example, the storage capacity of one zone is larger than the data capacity of the corresponding logical block address space by a data amount corresponding to 24 blocks. This assignment is considered to take care of a defective block. In a case where data is to be rewritten in the flash memory 2, a spare block in which new data is to be written is required. Accordingly, substantially 23 blocks are used as excessive blocks in one zone. The number of blocks included in one zone may be arbitrarily set based on the usage purpose of the flash memory system 1, the spec of the flash memory 2, etc.

When a corresponding logical block address is to be written in the redundant area 26 of each block, the logical block address supplied from the host system 4 may be directly written therein. Or in a case where each zone is assigned to a logical block address space where the zone is assigned to a logical block address space corresponding to 1000 blocks, a serial number (logical serial number) ranging from 0 to 999 may be written in the redundant area 26. Hereinafter, the serial number in the logical block address space assigned to each zone will be referred to as logical serial number. By adding an offset corresponding to each zone to the logical serial number, the actual logical block address is obtained. For example, in a case where in FIG. 6, the first address in the logical block address space assigned to the zone 0 is ADD0, the following offset is assigned to each zone.

Zone 0: ADD0
Zone 1: ADD0+1000□1
Zone 2: ADD0+1000□2
—
—
—
Zone N: ADD0+1000□N

The flash memory system 1 according to the present invention executes two steps for rewriting data. First, the flash memory system 1 writes new data in an erased block which has been subjected to block erasing. Second, the flash memory system 1 erases data in the block in which the old data is written. If power is turned off before the second step is executed, a block in which the new data is written and a block in which the old data is written are present simultaneously. In this case, the new data is the effective data. Accordingly, the flash memory system 1 needs to keep the block in which the new data is written and to block-erase the block in which the old data is written.

The flash memory system 1 according to the present invention writes identification information (version identifier) for identifying the block in which the new data is written and the block in which the old data is written in the redundant area 26 of each block. The flash memory system 1 identifies the block in which the old data is written based on the version identifier.

The version identifier and an identification process based on the version identifier will be described below.

FIG. 7 shows an example of version identifiers and corresponding logical block addresses that are written in the redundant areas 26. In this example, the version identifier and the corresponding logical block address are written in the redundant area 26 of each block included in one zone formed of 1024 blocks. The corresponding logical block addresses are described by logical serial numbers. In this example, 4 bits are assigned to the version identifier, and 11 bits are assigned to the corresponding logical block address. The 11-bit corresponding logical block address includes 10 bits for indicating the logical serial number (0 to 999) for the 1000 blocks assigned to one zone, and 1 bit for indicating whether data is written or not. The bit indicating whether data is written or not is the first bit. By adding the offset assigned to the zone to the 10 bits other than the first bit, the logical block address supplied from the host system 4 is obtained. The flash memory system 1 may identify whether data is written or not by setting a logical serial number 1023 (11 1111 1111b (binary number)) in a block in which no data is written.

In the example shown in FIG. 7, the version identifier of the block in which no data is written is set to 15 (1111b (binary number)). The corresponding logical block address of the block in which no data is written is set to 111 1111 1111b (binary number). A memory cell 16 in the erased state stores data representing the logic value '1'. Therefore, as a result of data erasing operation, the version identifier is set to 15 (1111b (binary number)) and the corresponding logical block address is set to 111 1111 1111b (binary number).

In the example shown in FIG. 7, the numbers 0 to 1023 given on the left of the version identifier are serial numbers assigned in the order of physical block addresses in each zone. Hereinafter, the serial number assigned in the order of physical block addresses in each zone will be referred to as physical serial number. By adding an offset corresponding to each zone to the physical serial number (0 to 1023), the actual physical block address in the flash memory 2 is obtained. For example, in a case where blocks in the flash memory 2 are assigned to zones 0 to N in the order of addresses, the following offset is assigned to each zone.

Zone 0: 0
Zone 1: 1024□1
Zone 2: 1024□2
—
—
—
Zone N: 1024□N

A process for updating the version identifier will now be explained with reference to the example shown in FIG. 8. FIG. 8 shows an example of changes of the version identifier in response to rewriting of data corresponding to a logical serial number 0 (00 0000 0000b (binary number)).

In this example, data corresponding to the logical serial number 0 is written in a block having the physical serial number 0 in step 0 (#0). After this, the version identifier is updated in the way described below, each time rewriting of the data corresponding to the logical serial number 0 is executed. Operations performed when data rewriting is repeatedly executed will be explained in order.

Step 1 (#1)

New data is written in a block corresponding to a physical serial number 6. Then, a version identifier 1 (0001b (binary number)) is written in the redundant area 26 of the block.

Step 2 (#2)

New data is written in a block corresponding to a physical serial number 17. Then, a version identifier 2 (0010b (binary number)) is written in the redundant area 26 of the block.

Step 3 (#3)

New data is written in a block corresponding to a physical serial number 175. Then, a version identifier 3 (0011b (binary number)) is written in the redundant area 26 of the block.

Step 4 (#4)

New data is written in a block corresponding to a physical block number 503. Then, a version identifier 4 (0100b (binary number)) is written in the redundant area 26 of the block.

Step 5 (#5)

New data is written in a block corresponding to a physical serial number 875. Then, a version identifier 5 (0101b (binary number)) is written in the redundant area 26 of the block.

In the following steps, the version identifier is updated in the same manner. In step 15 (#15), the version identifier become 15 (1111b (binary number)). In step 16 (#16), the version identifier returns to 0 (0000b (binary number)).

Step 15 (#15)

New data is written in a block corresponding to a physical serial number 1017. Then, a version identifier 15 (1111b (binary number)) is written in the redundant area 26 of the block.

Step 16 (#16)

New data is written in a block corresponding to a physical serial number 26. Then, a version identifier 0 (0000b (binary number))) is written in the redundant area 26 of the block.

In the example shown in FIG. 8, the version identifier is incremented by 1 each time data rewriting is executed. When the version identifier reaches 15 (1111b (binary number))), the version identifier is returned to 0 (0000b (binary number)). In a case where rewriting is executed properly, 111 1111 1111b (binary number) is set as the corresponding logical block address of the block in which the old data was written. Therefore, the block that has the corresponding logical block address 000 0000 0000b (binary number) is normally only the block in which the newest data is written.

However, in a case where power is turned off before the block erasing of the block in which the old data is written is executed, there may be a plurality of blocks that have the corresponding logical block address 000 0000 0000b (binary number).

A method for identifying the block in which new data is written in a case where a block in which new data is written and a block in which old data is written are present simultaneously, will be explained below.

First, an identifying method for a case where data corresponding to the same logical serial number is written in two blocks will be explained. In a case where the version identifier of one of the blocks in which the data corresponding to the same logical serial number is written is Na and the version identifier of the other of the blocks is Nb (Nb>Na), the block in which the new data is written is identified in the following manner.

In a case where Nb−Na=1 is satisfied, it is determined that the new data is written in the block having the version identifier Nb.

In a case where Nb−Na>1 is satisfied, it is determined that the new data is written in the block having the version identifier Na.

FIG. 9 shows an example where a block in which new data is written and a block in which old data is written are present simultaneously. In this example, data corresponding to a logical serial number 0 (00 0000 0000b (binary number)) is written in the block corresponding to the physical serial number 0 and the block corresponding to the physical serial number 6. A version identifier 0 (0000b (binary number)) is written in the block corresponding to the physical serial number 0. A version identifier 1 (0001b (binary number)) is written in the block corresponding to the physical serial number 6. When these version identifies are assigned to Na and Nb described above, the following result is obtained.

Na=0

Nb=1

$Nb-Na=1$

Accordingly, it is determined that the new data is written in the block corresponding to the physical serial number 6.

In a case where not the version identifier 1 but a version identifier 15 (1111b (binary number)) is written in the block corresponding to the physical serial number 6, the following result is obtained.

Na=0

Nb=15

$Nb-Na=15$

Accordingly, it is determined that the new data is written in the block corresponding to the physical serial number 0.

Next, a method for identifying the block in which the newest data is written in a case where data corresponding to the same logical serial number is written in three blocks. If the version identifiers of the three blocks in which the data corresponding to the same logical serial number is written are Na, Nb, and Nc (Na<Nb<Nc), the block in which the newest data is written is identified in the following manner.

First, the relationship between the block having the version identifier Na and the block having the version identifier Nb is determined.

In a case where Nb−Na=1 is satisfied, it is determined that the data written in the block having the version identifier Nb is newer than the data written in the block having the version identifier Na.

In a case where Nb−Na>1 is satisfied, it is determined that the data written in the block having the version identifier Na is newer than the data written in the block having the version identifier Nb.

Second, the relationship between the block having the version identifier Nb and the block having the version identifier Nc is determined.

In a case where Nc−Nb=1 is satisfied, it is determined that the data written in the block having the version identifier Nc is newer than the data written in the block having the version identifier Nb.

In a case where Nc−Nb>1 is satisfied, it is determined that the data written in the block having the version identifier Nb is newer than the data written in the block having the version identifier Nc.

Third, the relationship between the block having the version identifier Na and the block having the version identifier Nc is determined.

In a case where Nc−Na=2 is satisfied, it is determined that the data written in the block having the version identifier Nc is newer than the data written in the block having the version identifier Na.

In a case where the Nc−Na>2 is satisfied, it is determined that the data written in the block having the version identifier Na is newer than the data written in the block having the version identifier Nc.

Based on the results of determination in the three steps described above, the block in which the newest data is written is identified.

Specific three cases will be explained below.

In the first case, the version identifiers of the three blocks in which the data corresponding to the same logical serial number is written are the followings respectively.

Na=0

Nb=1

Nc=2

In this case, Nb−Na=1 and Nc−Nb=1 are satisfied. According to this determination, the data written in the block having the version identifier Nb is newer than the data written in the block having the version identifier Na. Further, the data written in the block having the version identifier Nc is newer than the data written in the block having the version identifier Nb. Accordingly, it is determined that the newest data is written in the block having the version identifier Nc.

In the second case, the version identifiers of the three blocks in which the data corresponding to the same logical serial number is written are the followings.

Na=0

Nb=1

Nc=15

In this case, Nb−Na=1, and Nc−Nb=14 are satisfied. Accordingly, the data written in the block having the version identifier Nb is newer than the data written in the block having the version identifier Na. Further, the data written in the block having the version identifier Nb is newer than the data written in the block having the version identifier Nc. Accordingly, it is determined that the newest data is written in the block having the version identifier Nb.

In the third case, the version identifiers of the three blocks in which the data corresponding to the same logical serial number is written are the followings.

Na=0

Nb=14

Nc=15

In this case, Nb−Na=14 and Nc−Na=15 are satisfied. Therefore, the data written in the block having the version identifier Na is newer than the data written in the block having the version identifier Nb. Further, the data written in the block having the version identifier Na is newer than the data written in the block having the version identifier Nc. Accordingly, it is determined that the newest data is written in the block having the version identifier Na.

If the normal operation procedures for rewriting data are followed, data corresponding to the same logical serial number is not written in three or more blocks. Even in a case where data corresponding to the same logical serial number is written in three or more blocks by an unassumed operation, the block in which the newest data is written can be identified by the identifying method described above.

In the above-described example, the version identifier is incremented by 1 each time data is rewritten. The block in which the newest data is written can be identified by a method in which the version identifier is decreased 1 by 1 from 15 (1111b (binary number)). According to this method, when the version identifier reaches 0 (0000b (binary number)), the version identifier is returned to 15 (1111b (binary number)). In the method in which the version identifier is decreased 1 by 1, the block in which the newest data is written is identified in the following manner. For example, in a case where the version identifier of one of the blocks in which the data corresponding to the same logical serial number is written is Na, and the version identifier of the other of the blocks is Nb (Nb>Na), identification is executed in the way described below.

In a case where Nb−Na=1 is satisfied, it is determined that the data written in the block having the version identifier Na is newer than the data written in the block having the version identifier Nb.

In a case where Nb−Na>1 is satisfied, it is determined that the data written in the block having the version identifier Nb is newer than the data written in the block having the version identifier Na.

The flash memory system 1 according to the present invention updates the version identifier each time data written in the data area 25 is rewritten. Therefore, it is preferred that the newest version identifier of each block be managed by a table. Therefore, an address translation table shown in FIG. 10 is used. The address translation table collectively manages the correspondence between the logical block address and the physical block address, and the correspondence between the logical block address and the version identifier. The address translation table manages the logical block address space corresponding to the 1000 blocks assigned to one zone. In the address translation table shown in FIG. 10, the version identifier and the physical block address are written in the order of logical serial numbers. The physical block address is written by its physical serial number. That is, for each logical serial number (0 to 999), the physical serial number of the block in which the data corresponding to the logical serial number is written, and the version identifier written in the redundant area 26 of the block are written in the address translation table. In FIG. 10, the logical serial numbers (0 to 999) are given on the left of the version identifiers, in order to indicate that the records are arranged in the order of logical serial numbers. In a case where no data corresponding to any logical serial number is written in a block, a version identifier 1111b (binary number) is written in the block. Further, a physical block address 111 1111 1111b (binary number) is written in the block. The first bit of the physical block address indicates whether data corresponding to a logical serial number is written in the block or not.

The address translation table shown in FIG. 10 must be updated each time data rewriting operation is executed. For example, in a case where the newest data corresponding to the logical serial number 0 is to be written in an erased block which is different from the block in which the old data is written, the following three processes are executed. First, a version identifier 0100b (binary number) is written in the redundant area 26 of the block. Second, the version identifier written in the table is updated from 0011b (binary number) to 0100b (binary number). Third, the physical block address in the table is rewritten to the physical serial number of the block in which the newest data corresponding to the logical serial number 0 is written.

Next, a method for generating the address translation table shown in FIG. 10 will be explained. First, an area in which version identifiers and physical serial numbers (physical block addresses) for 1000 blocks can be written is secured on the SRAM. Then, 1111b (binary number) is set as the initial setting in the portions in which the version identifiers are to be written. "111 1111 1111b (binary number)" is set in the portions in which the physical serial numbers (physical block addresses) are to be written. That is, data representing that no data is stored is written for all the blocks. Then, the following process is executed for the 1024 blocks which are assigned to the zone for which the table is to be generated. First, the redundant area 26 of each block is read sequentially. Next, in a case where a logical serial number indicating a logical block address is written in a portion of the redundant area 26 in which the corresponding logical block address should be written, the physical serial number of the block in which the logical serial number is written is written in a portion of the table corresponding to the logical serial number. In addition, the version identifier written together with the logical serial number is written in a portion of the table corresponding to the logical serial number. In this way, the address translation table is generated.

Not only by the above-described method using a value incremented by 1 each time data is rewritten as identification information (version identifier) for identifying the block in which new data is written and the block in which old data is written, but also by the below-described method in which the physical block address of a block in which old data is written is written as the version identifier, the object of the present invention can be achieved.

With reference to FIG. 11, a method in which the physical block address of a block in which old data is written is written as the version identifier will be explained. In the example shown in FIG. 11, the physical block address of the block in which old data is written is written together with the corresponding logical block address in the redundant area 26 of each block. In the portion of the redundant area 26 in which the version identifier should be written, the physical serial number of the block in which the old data is written is written in 10 bits. In the portion of the redundant area 26 in which the corresponding logical block address should be written, 11 bits are assigned. That is, 10 bits out of the 11 bits indicate the logical serial number (0 to 999) for the 1000 blocks assigned to one zone. The remaining 1 bit out of the 11 bits indicates whether data is written or not. In the portion in which the version identifier should be written of the block in which no data is written, 11 1111 1111b (binary number) is written. In the portion in which the corresponding logical block address should be written of the block in which no data is written, 111 1111 1111b (binary number) is written.

With reference to a specific example shown in FIG. 12, a version identifier updating process for a case where the physical block address of a block in which the old data is written is used as the version identifier will be explained.

Figure 12:
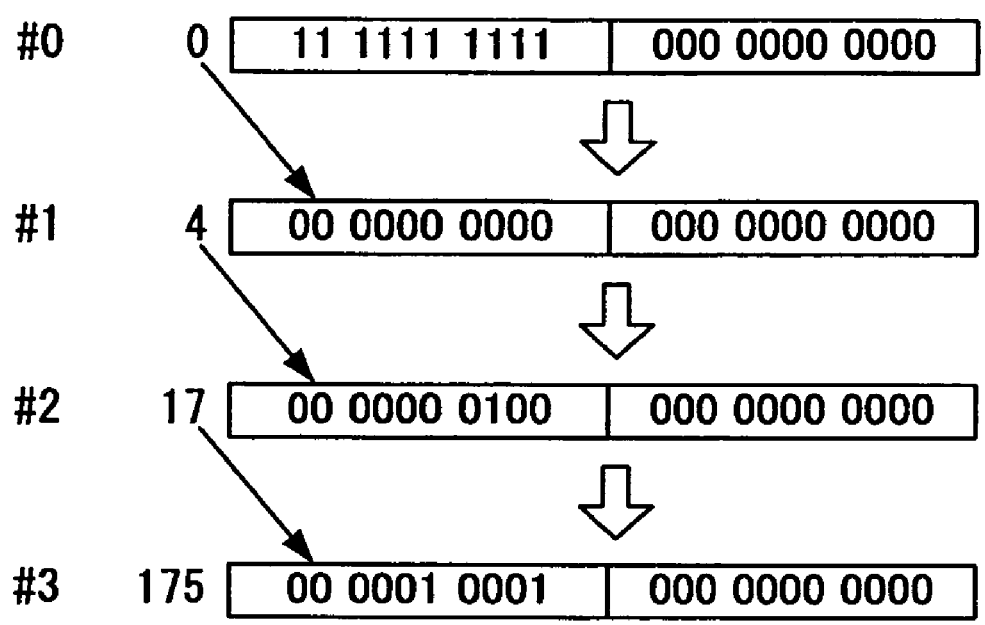
FIG. 12 is a schematic diagram showing procedures for updating version identifier.

FIG. 12 shows one example of changes of the version identifier in a case where rewriting of data corresponding to the logical serial number 0 (00 0000 0000b (binary number)) is executed.

In this example, the data corresponding to the logical serial number 0 is written in the block having the physical serial number 0 (00 0000 0000b (binary number)) in step 0 (#0). After this, the version identifier is updated in the manner described below, each time the data corresponding to the logical serial number 0 is rewritten.

Step 1 (#1)

New data is written in a block corresponding to the physical serial number 4 (00 0000 0100b (binary number)). Further, the physical serial number 0 (00 0000 0000b (binary number)) of the block in which the old data is written is written as the version identifier in the redundant area 26 of the block.

Step 2 (#2)

New data (data after rewritten) is written in a block corresponding to the physical serial number 17 (00 0001 0001b (binary number)). Further, the physical serial number 4 (00 0000 0100b (binary number)) of the block in which the old data is written is written as the version identifier in the redundant area 26 of the block.

Step 3 (#3)

New data (data after rewritten) is written in a block corresponding to the physical serial number 175 (00 1010 1111b (binary number)). Further, the physical serial number 17 (00 0001 0001b (binary number)) of the block in which the old data is written is written as the version identifier in the redundant area 26 of the block.

Next, a method for identifying a block in which new data is written in a case where the physical block address of a block in which old data is written is used as the version identifier will be explained.

In the version identifier updating process shown in FIG. 12, the physical serial number of the block in which old data is written is written in the redundant area 26 of the block in which new data is written. According to such a version identifier updating process, the physical serial number of the block in which the newest data is written is not written as the version identifier. Accordingly, in a case where there are a plurality of blocks in which data corresponding to the same logical serial number is written, the block in which the newest data is written is identified by comparing the version identifiers written in these blocks.

FIG. 13 shows an example where the data corresponding to the logical serial number 0 is written in the block having the physical serial number 0 and in the block having the physical serial number 4. The version identifier written in the block having the physical serial number 0 is 1023 (11 1111 1111b (binary number)), whereas the version identifier written in the block having the physical serial number 4 0 (00 0000 0000b (binary number)). That is, the physical serial numbers of the blocks in which the data corresponding to the logical serial number 0 is written are 0 (00 0000 0000b (binary number)), and 4 (00 0000 0100b (binary number)). Further, the physical serial numbers written as the version identifiers in the redundant areas 26 of the blocks in which the data corresponding to the logical serial number 0 is written are 1023 (11 1111 1111b (binary number)), and 0 (00 0000 0000b (binary number)). Of the physical serial numbers of the blocks in which the data corresponding to the logical serial number 0 is written, one that is not written as the version identifier in the redundant area 26 of any block is the physical serial number 4. Accordingly, it is determined that the newest data is written in the block having the physical serial number 4.

Figure 15:
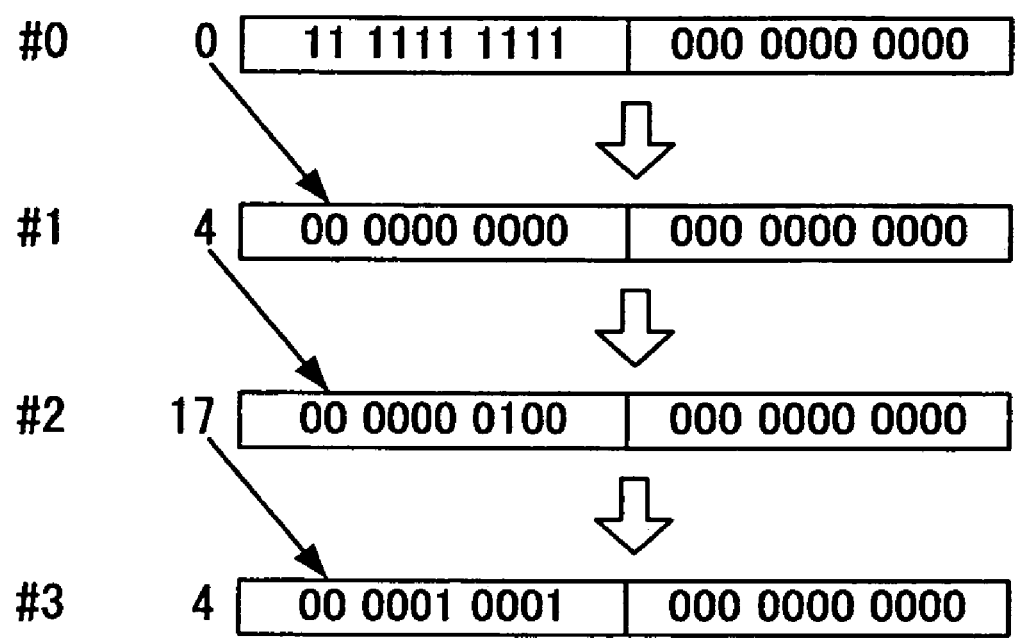
FIG. 15 is a schematic diagram showing unpreferable procedures for updating version identifier.

Note that in a case where as shown in FIG. 15, new data is written not in the block corresponding to the physical serial number 175 (00 1010 1111b (binary number)) but in the block corresponding to the physical serial number 4 (00 0000 0100b (binary number)) in step 3 (#3) in the above-described updating process and the data in the block corresponding to the physical serial number 17 (00 0001 0001b (binary number)) is not erased, the following situation occurs. That is, because the version identifier of the block corresponding to the physical serial number 17 is 4 and the version identifier of the block corresponding to the physical serial number 4 is 17, the block in which the newest data is written cannot be identified. By arranging that new data not be written in a block corresponding to the version identifier of a block in which the immediate anterior data is written, such a trouble can be avoided.

Next, a method for identifying the block in which the newest data is written in a case where data corresponding to the same logical serial number is written in three blocks will be explained. A case will be explained where the data corresponding to the logical serial number 0 is also written in the block having the physical serial number 17 in the example shown in FIG. 13. In the redundant area 26 of the block having the physical serial number 17, the physical serial number 4 (00 0000 0100b (binary number)) is written as the version identifier. In this example, the physical serial numbers of the three blocks in which the data corresponding to the logical serial number 0 is written are 0 (00 0000 0000b (binary number)), 4 (00 0000 0100b (binary number)), and 17 (00 0001 0001b (binary number)) respectively. The physical serial numbers written as the version identifiers in the redundant areas 26 of the blocks in which the data corresponding to the logical serial number 0 is written are 1023 (11 1111 1111b (binary number)), 0 (00 0000 0000b (binary number)), and 4 (00 0000 0100b (binary number)), respectively. Of the physical serial numbers of the blocks in which the data corresponding to the logical serial number 0 is written, one that is not written as the version identifier in the redundant area 26 of any block is only the physical serial number 17. Accordingly, it is determined that the newest data is written in the block having the physical serial number 17.

Next, with reference to FIG. 14, a method for searching for an erased block in which new data is to be written will be explained. To search for an erased block, an erased block search table as shown in FIG. 14A is used. The erased block search table is secured on the SRAM. Each bit on the erased block search table corresponds to a block included in a zone. The logic value ("0" or "1") of each bit represents a state where data is written or a state where no data is written. The logic value "0" represents a state where data is written. The logic value "1" represents a state where no data is written. The bit on the upper left of the erased block search table corresponds to the block having the physical serial number 0. In each row of the erased block search table, the bit on the right of a given bit by one corresponds to a block having a physical serial number larger by one than that of the block corresponding to the given bit. The bit on the leftmost of a given row of the erased block search table corresponds to a block having a physical serial number larger by one than that of a block corresponding to the bit on the rightmost of the row above the given row by one. The bit on the lower right of the erased block search table corresponds to a block having the physical serial number 1023.

In the erased block search table shown in FIG. 14A, in a case where data is written in a block corresponding to a bit or in a case where a block status representing that the block is a defective block is written in a block corresponding to a bit, the logic value "0" is set to the bit. In a case where no data is written in a block corresponding to a bit, the logic value "1" is set to the bit. The erased block search table can be generated simultaneously when the address translation table shown in FIG. 10 is generated. For example, the address translation table is generated by the following procedure. First, the logic value "0" is set in the area on the SRAM where the erased block search table is to be generated. Next, in a case where neither a corresponding logical block address nor a block status representing a defective block is written in the redundant area 26 of each block, the logic value "1" is set to the bit corresponding to the block. By this procedure, the erased block search table can be generated simultaneously when the address translation table is generated. That is, this procedure is executed when data written in the redundant area 26 of a block included in a zone is read. As a result, the logic value "1" is set to only the bits corresponding to erased blocks. The bits corresponding to blocks other than the erased blocks are maintained as the initially set logic value "0". After the erased block search table is generated, the value of each bit is updated in the manner described below in accordance with processes executed. When data is written in an erased block, the bit corresponding to the block is updated from the logic value "1" to the logic value "0". When a block in which data is written is block-erased, the bit corresponding to the block is updated from the logic value "0" to the logic value "1".

Next, with reference to FIG. 14B, a method for searching for an erased block by using the erased block search table will be explained. The erased block search table is scanned from the bit corresponding to the block having the physical serial number 0 to the bit corresponding to the block having the physical serial number 1023. By scanning, a bit set to the logic value "1" is searched out. The erased block search table is scanned from an upper row to a lower row. Each row of the erased block search table is scanned from the left to the right.

In a case where the erased block search table shown in FIG. 14B is searched, scanning is started from the leftmost bit on the uppermost row. The first bit that is set to the logic value "1" is the fifth bit from the left of the fourth row from the top. Search for an erased block is finished at this bit. New data is written in the block having the physical serial number 28 corresponding to this bit. In the next search, scanning is started from the sixth bit from the left of the fourth row from the top. When scanning reaches the rightmost bit on the lowermost row, scanning is continued by returning to the leftmost bit on the topmost row.

Next, a data writing operation for writing new data in an erased block searched out by using the erased block search table will be explained. In the data writing operation, first, the data to be written is acquired into the buffer 9 shown in FIG. 1. Next, settings for data writing operation are made in the registers included in the flash memory sequencer block 12 in the way described below.

First, an internal write command as an internal command is set in a predetermined register of the flash memory sequencer block 12.

Second, the offset assigned for each zone is added to the physical serial number of the erased block searched out by using the erased block search table. As a result, the physical block address is generated. A page address obtained by adding 5 bits corresponding to a page number to the physical block address is set in a predetermined register of the flash memory sequencer block 12.

After this, the flash memory sequencer block 12 executes a process based on the internal write command set in the predetermined register. When the process is executed, command information, address information, etc. for executing the internal write command are supplied to the flash memory 2 from the flash memory interface block 10 via the internal bus 14. The data to be written retained in the buffer 9 is also supplied to the flash memory 2 via the internal bus 14. Thereby, the data is written in the page which is set in the predetermined register of the flash memory sequencer block 12.

Next, a process to be executed after the writing operation is completed will be explained. The version identifier is set in the redundant area 26 of the block in which the data is written. Further, the logical serial number of the data written in the block is written in the portion of the redundant area 26 in which the corresponding logical block address should be written. The writing operation for writing in the redundant area 26 will be explained below. First, data such as the version identifier, the logical serial number, etc. are set in the buffer 9 in which data to be written in the redundant area 26 is set. Next, a command, an address, etc. are set in a predetermined register of the flash memory sequencer block 12. After this, the version identifier, the logical serial number, etc. are written in the redundant area 26 based on the command, the address, etc. set in the predetermined register of the flash memory sequencer block 12.

The controller 3 may execute an initialization thereof in response to (at a timing immediately after) activation of the memory system or in response to (at a timing of) system reset. In the initialization process, the controller 3 prepares the address translation table in the work area 8 of the SRAMs and searches memory blocks in the flash memory 2 which store a same logical block address by reading out the physical address of each memory block and the logical address stored therein. When finding memory blocks storing the same logical block address, the controller 3 identifies an effective block which stores newest data based on the version identifier and prepares the address translation table based on the information regarding the identified effective block, for example, in the initialization process. The identification of the effective block may be executed when the host system requests to access the logical block address.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2003-432516 filed on Dec. 26, 2003 and including specification, claims, drawings and summary. The disclosure of the above Japanese Patent Application is incorporated herein by reference in its entirety.

What is claimed is:

1. A memory controller comprising:
   an access unit which accesses a flash memory and writes, in a physical block of the flash memory, data corresponding to a logical block assigned to the physical block;
   a version identifier setting unit which writes a version identifier of data written to the physical block by said access unit in a redundant area of the physical block; and
   a version identifying unit which identifies the physical block in which newest data is written, from a plurality of physical blocks corresponding to a same logical block, based on version identifiers written in redundant areas of the plurality of physical blocks.

2. The memory controller according to claim 1, wherein each of the version identifiers includes information representing a value which is increased or decreased each time data corresponding to the same logical block is rewritten to a different physical block of the flash memory.

3. The memory controller according to claim 1, wherein each of the version identifiers includes information which is based on a physical block address of a prior physical block in which prior data corresponding to the same logical block is stored.

4. A flash memory system comprising:
   a flash memory;
   an access control unit which controls access to said flash memory and writes, in a physical block of the flash memory, data corresponding to a logical block assigned to the physical block;
   a version identifier setting unit which writes a version identifier of data written to the physical block by said access unit, in a redundant area of the physical block; and
   a version identifying unit which identifies the physical block in which newest data is written, from a plurality of physical blocks corresponding to a same logical block, based on version identifiers written in redundant areas of the plurality of physical blocks.

5. The flash memory system according to claim 4, wherein each of the version identifiers includes information representing a value which is increased or decreased each time data corresponding to the same logical block is rewritten to a different physical block of the flash memory.

6. The flash memory system according to claim 4, wherein each of the version identifiers includes information which is based on a physical block address of a prior physical block in which prior data corresponding to the same logical block is stored.

7. A method for storing data on a flash memory comprising the steps of:
   writing, in a physical block of a flash memory, data corresponding to a logical block assigned to the physical block;
   setting a version identifier of data written in the physical block in a redundant area of the physical block; and
   identifying a physical block in which newest data is written, from a plurality of physical blocks corresponding to a same logical block, based on version identifiers written in redundant areas of the plurality of physical blocks.

8. The method according to claim 7, wherein each of the version identifiers is information representing a value which is increased or decreased each time data corresponding to the same logical block is rewritten to a different physical block of the flash memory.

9. The method according to claim 7, wherein each of the version identifiers is information which is based on a physical block address of a prior physical block in which prior data corresponding to the same logical block is stored.

10. A memory controller comprising:
    a receiver which receives data to be written in a flash memory from a host system;
    a physical block designator which designates a physical block of the flash memory to which a logical block corresponding to the data received by said receiver is assigned;
    a version identifier manager which assigns a version identifier to the data received by said receiver, the version identifier representing a version of data corresponding to a same logical block;
    an access unit which writes the data received by said receiver to the physical block designated by said physical block designator, and which writes a logical block address of the logical block corresponding to the data received by said receiver and the version identifier assigned by said version identifier manager, to a redundant area of the physical block, and
    an effective block identifying unit which searches physical blocks in whose redundant areas a same logical block address is written, and in case of finding physical blocks in whose redundant areas the same logical block address is written, identifies an effective physical block which stores newest data corresponding to, the same logical block, based on version identifiers written in the redundant areas of the found physical blocks.

11. The memory controller according to claim 10, wherein each of the version identifiers includes information representing a value which is increased or decreased each time data corresponding to a particular logical block is written to a different physical block of the flash memory.

12. The memory controller according to claim 10, wherein each of the version identifiers includes information which is based on a physical block address of a prior physical block in which prior data corresponding to a particular logical block is stored.

13. The memory controller according to claim 10, further comprising a correspondence managing unit which stores data representing correspondence between the logical block and the effective physical block storing newest data corresponding to the logical block,
- wherein said access unit accesses the flash memory based on the data representing the correspondence stored in the correspondence managing unit; and
- said effective block identifying unit performs said searching and identifying, based on the logical block address and the version identifiers, and prepares data representing the correspondence.

14. A flash memory system comprising:
- a flash memory; and
- the memory controller according to claim 10.

15. A memory controller comprising:
- access means for accessing a flash memory and writing, in a physical block of the flash memory, data corresponding to a logical block assigned to the physical block;
- version identifier setting means for writing a version identifier of data written in the physical block by said access means, in a redundant area of the physical block; and
- version identifying means for identifying an effective physical block in which newest data corresponding to a same logical block is written, from a plurality of physical blocks corresponding to the same logical block, based on version identifiers written in redundant areas of the plurality of physical blocks.

* * * * *